(12) United States Patent
Seki et al.

(10) Patent No.: US 7,567,111 B2
(45) Date of Patent: Jul. 28, 2009

(54) POTENTIAL FIXING CIRCUIT FOR INTEGRATED CIRCUIT HAVING MULTIPLE SUPPLY POTENTIALS

(75) Inventors: Hiroshi Seki, Suwa (JP); Hiroshi Tokiwai, Chino (JP)

(73) Assignee: Seiko Epson Corporation (JP)

( * ) Notice: Subject to any disclaimer, the term of this patent is extended or adjusted under 35 U.S.C. 154(b) by 156 days.

(21) Appl. No.: 11/423,800

(22) Filed: Jun. 13, 2006

(65) Prior Publication Data
US 2006/0279347 A1    Dec. 14, 2006

(30) Foreign Application Priority Data
Jun. 14, 2005  (JP)  ............... 2005-173292

(51) Int. Cl.
*H03L 5/00* (2006.01)
(52) U.S. Cl. ............... 327/333; 326/68; 326/81
(58) Field of Classification Search ........ 327/121, 327/333; 326/63, 68, 80–83
See application file for complete search history.

(56) References Cited

U.S. PATENT DOCUMENTS

| | | | |
|---|---|---|---|
| 5,473,496 A | 12/1995 | Rouy | |
| 6,043,699 A * | 3/2000 | Shimizu | ............ 327/333 |
| 6,545,521 B2 * | 4/2003 | Dale et al. | ............ 327/333 |
| 6,724,223 B2 * | 4/2004 | Ichiguchi et al. | ............ 326/81 |

(Continued)

FOREIGN PATENT DOCUMENTS

| | | |
|---|---|---|
| JP | 06-236693 | 8/1994 |
| JP | 2002-176349 | 6/2002 |
| JP | 2004-208108 | 7/2004 |
| JP | 2004-363640 | 12/2004 |

OTHER PUBLICATIONS http://electrosofts.com/digital/gates.html.*
http://www.kpsec.freeuk.com/gates.htm.*
Working with Digital gate http://electrosofts.com/digital/gates.html.*

*Primary Examiner*—Long Nguyen
*Assistant Examiner*—Brandon S Cole
(74) *Attorney, Agent, or Firm*—Harness, Dickey & Pierce, P.L.C.

(57) ABSTRACT

A semiconductor integrated circuit operates at two or more supply potentials including a first supply potential and a second supply potential that is higher than the first supply potential, and includes (1) an internal circuit that operates at the first supply potential, (2) an inverter that inverts a control signal fed from the internal circuit and outputs the inverted control signal, when the first supply potential is fed, (3) a level-shifting circuit that inputs the control signal to a first input terminal, while inputting the inverted control signal to a second input terminal, and outputs, from an output terminal, a level-shifted signal of the signal inputted to the first or the second terminal, when the second supply potential is fed, (4) a first input circuit that performs a logical operation on the basis of an input signal inputted via an input pad and a level-shifted signal outputted from the level-shifting circuit, when the second supply potential is fed, thereby outputting a signal corresponding to the input signal when the control signal is activated, while fixing the output level when the control signal is deactivated and (5) a second input circuit that operates on the basis of the signal outputted from the first input circuit when the first supply potential is fed, thereby feeding a signal to the internal circuit.

10 Claims, 8 Drawing Sheets

U.S. PATENT DOCUMENTS 6,894,545 B2    5/2005   Kodama
7,282,961 B1 *  10/2007  Daudelin et al. ............ 326/121

2002/0180483 A1 * 12/2002  Lim et al. ..................... 326/83
2005/0068062 A1 *  3/2005  Yamasaki et al. ............. 326/81

* cited by examiner

POTENTIAL FIXING CIRCUIT FOR INTEGRATED CIRCUIT HAVING MULTIPLE SUPPLY POTENTIALS

BACKGROUND

1. Technical Field

The present invention generally relates to a semiconductor integrated circuit such as an integrated circuit (IC) and a large-scale integration (LSI). More particularly, the invention relates to a semiconductor integrated circuit that operates at more than one power potential.

2. Related Art

In recent years, with a view to enhancing the operational speed of various electronic equipments as well as lowering the electric power consumption thereof, progress has been made in the degrees of high integration and low-voltage operation of semiconductor integrated circuits including ICs and LSIs used in those equipments. However, in view of device-specific properties, it is extremely difficult to lower the operational voltage of all semiconductor integrated circuits in a unified manner. Thus, there arise some cases where two or more integrated circuits operating at different supply potentials are interconnected.

In order to cope with such cases, semiconductor integrated circuits having an input circuit operating at a high supply potential and an internal circuit operating at a low supply potential are being developed. The input circuit of a semiconductor integrated circuit thus operating at two types of supply potentials will be described below in referencing FIGS. 9 to 11.

Figure 9:
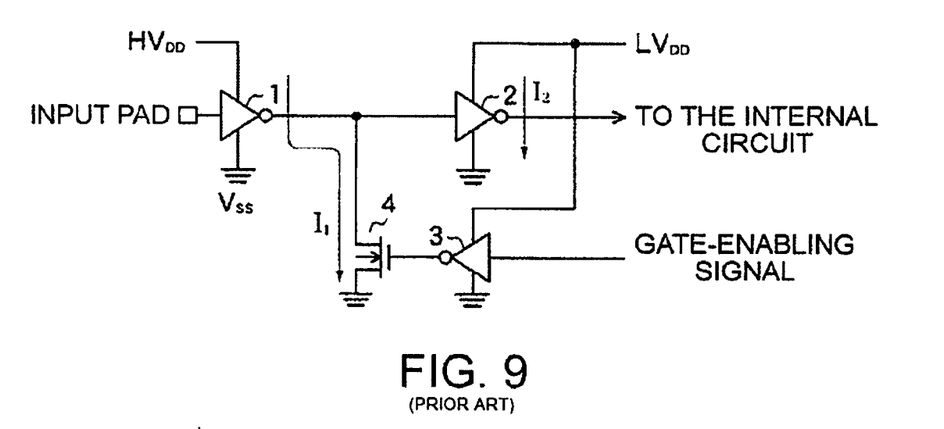
FIG. 9 is a circuit diagram showing a first input circuit of a related art semiconductor integrated circuit.

FIG. 9 is a circuit diagram showing a first input circuit of a related art semiconductor integrated circuit. The input circuit shown in FIG. 9 includes (1) an inverter 1 that inputs a signal from an external circuit via an input pad, to invert and output the input signal when a supply potential $HV_{DD}$ (e.g. 3.3 V) is fed and (2) an inverter 2 that inverts the output signal from the inverter 1 to output to an internal circuit, when a supply potential $LV_{DD}$ (e.g. 1.8 V) is fed.

In the above semiconductor integrated circuit, the supply potential $HV_{DD}$ is not fed in some cases even when the supply potential $LV_{DD}$ is fed. Reasons for such cases include reduction of power consumption when there is no need to input a signal from outside. Since, in such a case, output from the inverter 1 is in a high-impedance state, an inconsistency may occur in the input level of the inverter 2, thereby causing a through current $1_2$ to flow in the inverter 2. In order to prevent such a situation, a control signal (gate-enabling signal), being synchronized with the ON/OFF of the supply potential $HV_{DD}$, is used.

Thus, the input circuit has (1) an inverter 3 that inverts the gate-enabling signal when the supply potential $LV_{DD}$ is fed and (2) an N-channel MOS transistor 4 that performs a switching operation when the inverted gate-enabling signal is imprinted on the gate. The transistor 4 fixes the input potential of the inverter 2 at a low level when the gate-enabling signal is low-level, that is, when the inverted gate-enabling signal is high-level.

Figure 10:
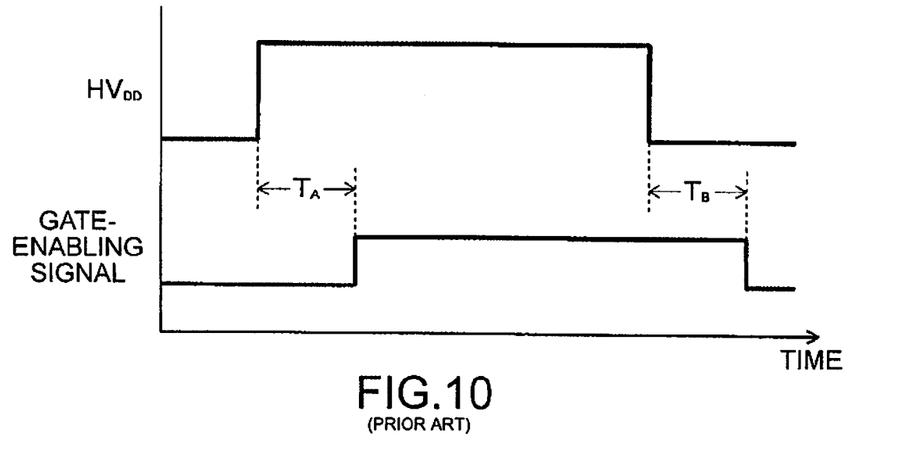
FIG. 10 is a timing chart showing changes in the supply potential $HV_{DD}$ and the gate-enabling signal.

FIG. 10 is a timing chart showing changes in the supply potential $HV_{DD}$ and the gate-enabling signal. As shown therein, the gate-enabling signal turns high-level when the supply potential $HV_{DD}$ is fed, whereas it turns low-level when the supply potential $HV_{DD}$ is no more fed. However, some difference occurs in the timing of the changes in the gate-enabling signal with respect to the ON/OFF timing of the supply potential $HV_{DD}$, thereby generating a time $T_A$, where the gate-enabling signal is low-level even though the supply potential $HV_{DD}$ is fed, and/or a time $T_B$, where the gate-enabling signal is high-level even though the supply potential is not fed.

In the case of the input circuit shown in FIG. 9, a through current $I_1$ may flow in the inverter 1 because the transistor 4 is ON during the time $T_A$ where the supply potential $HV_{DD}$ is fed and the gate-enabling signal is low-level. On the other hand, a through current $I_2$ may flow in the inverter 2 because the input level of the inverter 2 becomes inconsistent during the time $T_B$ where the supply potential $HV_{DD}$ is not fed and the gate-enabling signal is high-level.

Figure 11:
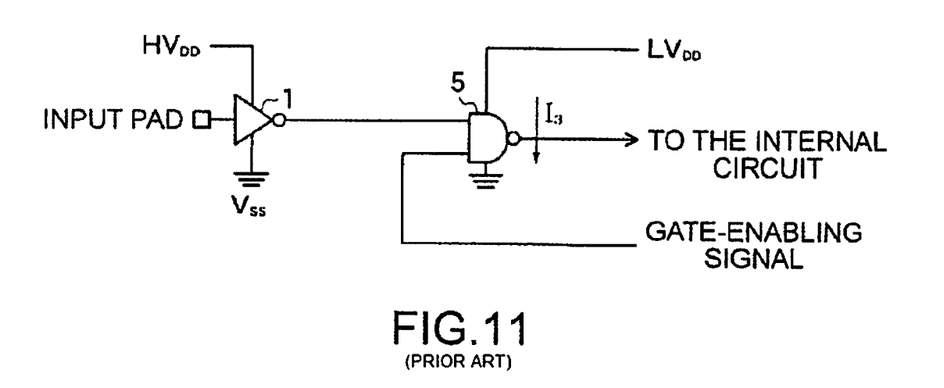
FIG. 11 is a circuit diagram showing a second input circuit of a related art semiconductor integrated circuit.

FIG. 11 is a circuit diagram showing a second input circuit of the related art semiconductor integrated circuit. The input circuit shown therein has (1) an inverter 1 that inputs a signal from an external circuit via an input pad, to invert and output the input signal when the supply potential $HV_{DD}$ (e.g. 3.3 V) is fed and (2) a NAND circuit 5 that sets up a logical multiplication of the output signal from the inverter 1 and the gate-enabling signal when the supply potential $LV_{DD}$ (e.g. 1.8 V) is fed, to invert and output the result to an internal circuit.

In the case of the input circuit shown in FIG. 11, output from the NAND circuit 5 is forcibly fixed at a high level during the time $T_A$ where the supply potential $HV_{DD}$ is fed and the gate-enabling signal is low-level. On the other hand, a through current $I_3$ may flow in the NAND circuit 5 because the input level of the inverter 2 becomes inconsistent during the time $T_B$ where the supply potential $HV_{DD}$ is not fed and the gate-enabling signal is high-level.

As a related art having connection with the examples described above, JP-A-6-236693 discloses a device that protects an integrated circuit against any undesired or unexpected power-offs so that data will not be stored or erased randomly. The device includes a cutoff means that is serially connected between a voltage supply generating a programming/erasing voltage $V_{PP}$ and the feeding input of an integrated circuit corresponding to the voltage supply. The device further includes a means that makes the cutoff means active by being connected to the voltage supply that generates a normal supply voltage $V_{CC}$. The cutoff means is made active when the value of the voltage $V_{CC}$ falls lower than a threshold value, in order to protect data from being rewritten or erased. However, JP-A-6-236693 discloses no information about preventing a through current that occurs in an input circuit when any of the supply potentials is turned ON/OFF.

SUMMARY

An advantage of the invention is to prevent a through current from occurring in an input circuit in a semiconductor integrated circuit operating at two or more supply potentials, when any of the supply potentials is turned ON/OFF.

According to a first aspect of the invention, a semiconductor integrated circuit operates at two or more supply potentials including a first supply potential and a second supply potential that is higher than the first supply potential. The semiconductor integrated circuit includes (1) an internal circuit that operates at the first supply potential, (2) an inverter that inverts a control signal fed from the internal circuit and outputs an inverted control signal, when the first supply potential is fed, (3) a level-shifting circuit that inputs the control signal to a first input terminal while inputting the inverted control signal to a second input terminal and, when the second supply potential is fed, shifts the level of the signal inputted to the first or the second terminal and outputs a level-shifted signal from the output terminal, (4) a first input circuit that performs a logical operation when the second supply potential is fed, based on an input signal inputted via an input pad and the level-shifted signal outputted from the level-shifting circuit, thereby outputting a signal corresponding to the input signal when the control signal is activated, and fixing the output level when the control signal is deactivated and (5) a second input circuit that operates on the basis of the signal outputted from the first input circuit when the first supply potential is fed, thereby feeding a signal to the internal circuit.

Here, the semiconductor integrated circuit may further include a potential-fixing circuit that fixes the potential at either of the first and the second input terminals of the level-shifting circuit as well as at the output terminal, when the second supply potential is fed and the first supply potential is not fed.

Furthermore, the first input circuit may set up a logical multiplication of the input signal inputted via the input pad and the level-shifted signal outputted from the level-shifting circuit, when the second supply potential is fed.

In this case, the level-shifting circuit may include (1) a first P-channel MOS transistor and a first N-channel MOS transistor, serially connected and having a gate connected to the first input terminal, (2) a second P-channel MOS transistor and a second N-channel MOS transistor having a gate connected to the second input terminal and a drain connected to the output terminal, (3) a third P-channel MOS transistor that feeds a current to the first P-channel MOS transistor and the first N-channel MOS transistor and (4) a fourth P-channel MOS transistor that feeds a current to the second P-channel MOS transistor and the second N-channel MOS transistor, the potential-fixing circuit fixing the potentials at the first input terminal and the output terminal at low levels when the second supply potential is fed whereas the first supply potential is not.

Alternatively, the first input circuit may set up a logical addition of the input signal inputted via the input pad and the level-shifted signal outputted from the level-shifting circuit, when the second supply potential is fed.

In this case, the level-shifting circuit may include (1) a first P-channel MOS transistor and a first N-channel MOS transistor, serially connected and having a gate that is connected to the first input terminal and a drain that is connected to the output terminal, (2) a second P-channel MOS transistor and a second N-channel MOS transistor having a gate connected to the second input terminal, (3) a third P-channel MOS transistor feeding a current to the first P-channel MOS transistor and the first N-channel MOS transistor and (4) a fourth P-channel MOS transistor feeding a current to the second P-channel MOS transistor and the second N-channel MOS transistor. Also, the potential-fixing circuit may fix the potential at the first input terminal of the level-shifting circuit at a low level while fixing the potential at the output terminal thereof at a high level, when the second supply potential is fed and the first supply potential is not.

In the semiconductor integrated circuit described above, the second input circuit may perform a logical operation when the first supply potential is fed, based on the signal outputted from the first input circuit as well as the level of the second supply potential, thereby outputting a signal, corresponding to the signal outputted from the first input circuit, to an internal circuit when the second supply potential is fed, and fixing the output level when the second supply potential is not fed.

According to a second aspect of the invention, a semiconductor integrated circuit operates at two or more supply potentials including a first supply potential and a second supply potential that is higher than the first supply potential. The semiconductor integrated circuit includes (1) an internal circuit that operates at the first supply potential, (2) a first input circuit that operates when the second supply potential is fed, based on an input signal inputted via an input pad and (3) a second input circuit that performs a logical operation when the first supply potential is fed, based on the signal outputted from the first input circuit as well as the level of the second supply potential, thereby outputting a signal, corresponding to the signal outputted from the first input circuit, to the internal circuit when the second supply potential is fed, and fixing the output level when the second supply potential is not fed.

Here, when the first supply potential is fed, the second input circuit may set up a logical multiplication of the signal outputted from the first input circuit and the level of the second supply potential, or, alternatively, the second input circuit may invert the level of the second supply potential to set up a logical addition of the signal outputted from the first input circuit and the inverted level of the second supply potential.

According to the first aspect of the invention, a semiconductor integrated circuit is prevented from a through current that occurs in the input circuit when the second supply potential is turned ON/OFF, by having the first input circuit that fixes the output level when the control signal, being synchronized with the ON/OFF of the second supply potential, is deactivated. According to the second aspect of the invention, a semiconductor integrated circuit is prevented from a through current that flows in the input circuit when the second supply potential is turned ON/OFF, by having the second input circuit that fixes the output level when the second supply potential is not fed.

BRIEF DESCRIPTION OF THE DRAWINGS

The invention will be described with reference to the accompanying drawings, wherein like numbers reference like elements.

DESCRIPTION OF THE EMBODIMENTS

Embodiments of the invention will now be described in detail with reference to the accompanying drawings, wherein like numbers reference like elements, description thereof being omitted.

Figure 1:
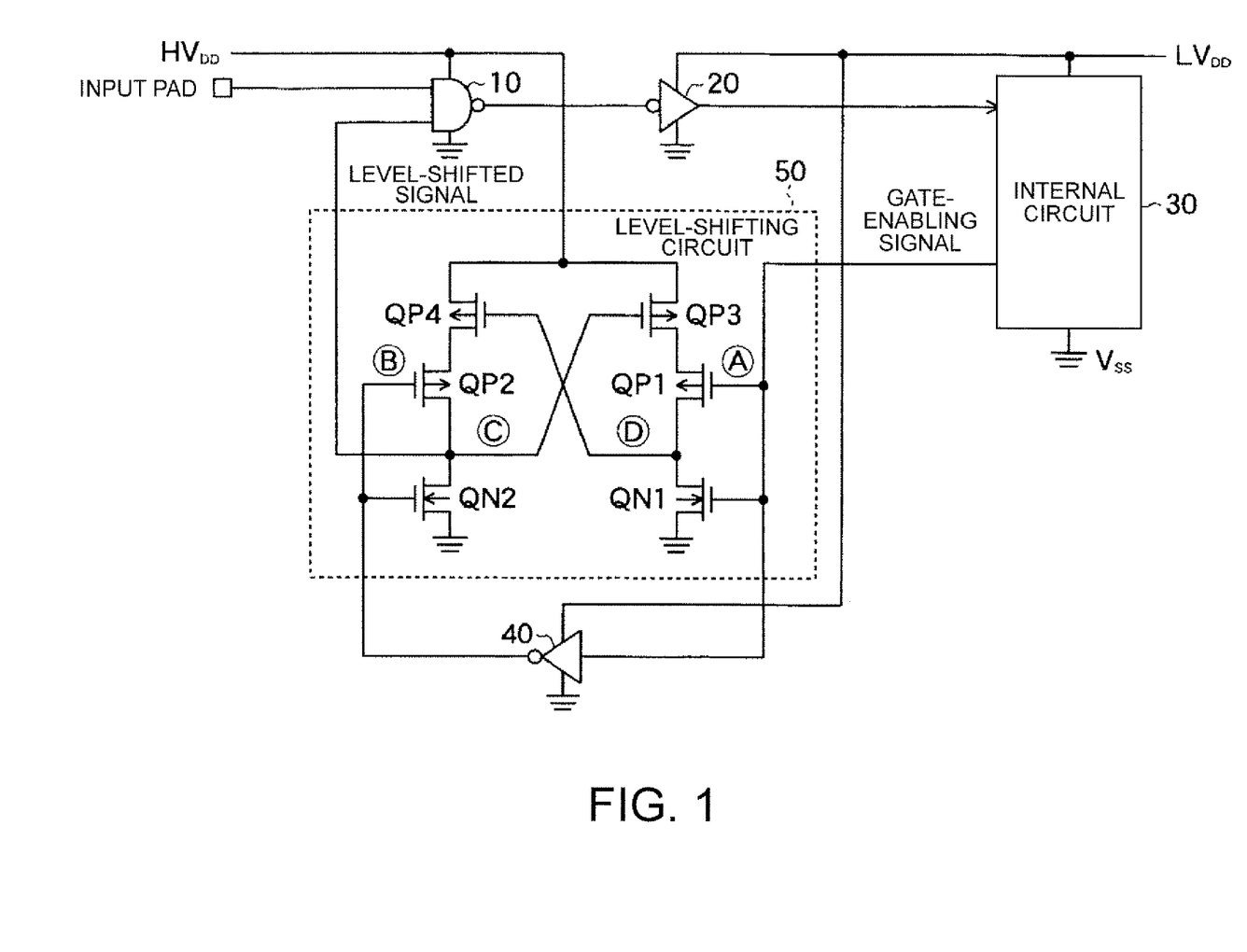
FIG. 1 is a diagram showing the configuration of a semiconductor integrated circuit according to a first embodiment of the invention.

FIG. 1 is a diagram showing the configuration of a semiconductor integrated circuit according to a first embodiment of the invention. The semiconductor integrated circuit operates at a first supply potential $LV_{DD}$ (e.g., 1.8 V), a second supply potential $HV_{DD}$ (e.g., 3.3 V) and a reference potential $V_{SS}$ (e.g., ground potential).

As shown in FIG. 1, the semiconductor integrated circuit has (1) a first input circuit (a NAND circuit 10 in the present embodiment) that operates on the basis of an input signal inputted from an external circuit via an input pad when the supply potential $HV_{DD}$ is fed, (2) a second input circuit (an inverter 20 in the embodiment) that operates on the basis of the signal outputted from the first input circuit when the supply potential $LV_{DD}$ is fed, (3) an internal circuit 30 that operates on the basis of the signal fed from the second input circuit when the supply potential $LV_{DD}$ is fed, (4) an inverter 40 that inverts a control signal (gate-enabling signal) fed from the internal circuit and outputs the inverted gate-enabling signal, when fed with the supply potential $LV_{DD}$, and (5) a level-shifting circuit 50 that outputs a level-shifted signal on the basis of either the gate-enabling signal or the inverted gate-enabling signal.

When the supply potential $HV_{DD}$ is fed, the first input circuit performs a logical operation based on the input signal inputted via the input pad and the level-shifted signal outputted from the level-shifting circuit 40, thereby outputting a signal corresponding to the input signal when the control signal is activated, and fixing the output level when the control signal is deactivated. In the embodiment, a NAND circuit 10 is used as the first input circuit, setting up a logical multiplication of the input signal and the level-shifted signal when the supply potential $HV_{DD}$ is fed, to invert and output the result.

The inverter 20, being used as the second input circuit, inverts the output signal from the NAND circuit 10 to output to the internal circuit 30. The internal circuit 30, when fed with the supply potential $LV_{DD}$, operates on the basis of the output signal from the inverter 20 to generates a gate-enabling signal that is synchronized with the ON/OFF of the supply potential $HV_{DD}$. The inverter 40, when fed with the supply potential $LV_{DD}$, inverts the gate-enabling signal and outputs the inverted gate-enabling signal.

The level-shifting circuit 50 includes (1) a P-channel MOS transistor QP1 and an N-channel MOS transistor QN1, being serially connected and having a gate that is connected to a first input terminal (node A) and a drain that is connected to a second output terminal (node D), (2) a P-channel MOS transistor QP2 and an N-channel MOS transistor QN2, having a gate that is connected to a second input terminal (node B) and a drain that is connected to a first output terminal (node C), (3) a P-channel MOS transistor QP3 that feeds a current to the transistors QP1 and QN1 and (4) a P-channel MOS transistor QP4 that feeds a current to the transistors QP2 and QN2.

The level-shifting circuit 50 inputs a gate-enabling signal to the first input terminal (node A) and an inverted gate-enabling signal to the second input terminal (node B). When the supply potential $HV_{DD}$ is fed, the level-shifting circuit 50 shifts the levels of the signals inputted to the first and the second input terminals, thereby generating level-shifted signals at the first output terminal (node C) and the second output terminal (node D), respectively. The signals are then outputted from either of the first and the second output terminals (the first output terminal (node C) in the embodiment).

Such a configuration of the input circuit allows the level-shifted signal outputted from the level-shifting circuit 50 to be low-level, thereby fixing the output from the NAND circuit 10 at a high level, during the time $T_A$ where the gate-enabling signal is low-level although the supply potential $HV_{DD}$ is fed, as shown in FIG. 10. This prevents a through current from occurring in the input circuit.

Next, a second embodiment of the invention will be described.

In the semiconductor integrated circuit according to the first embodiment, which is shown in FIG. 1, the supply potential $HV_{DD}$ is sometimes fed even though the supply potential $LV_{DD}$ is not fed. This occurs from the reason, for example, that the external circuit connected to the input pad is in operation. In such cases, because the outputs from the external circuit 30 and the inverter 40 are in a high-impedance state (inconsistency in the potential), a through current may flow via the transistors QP3, QP1 and QN1, depending on the potentials at the node A and node B. Furthermore, a through current may flow via the transistors QP4, QP2 and QN2, depending on the potentials at the node A and node B.

Figure 2:
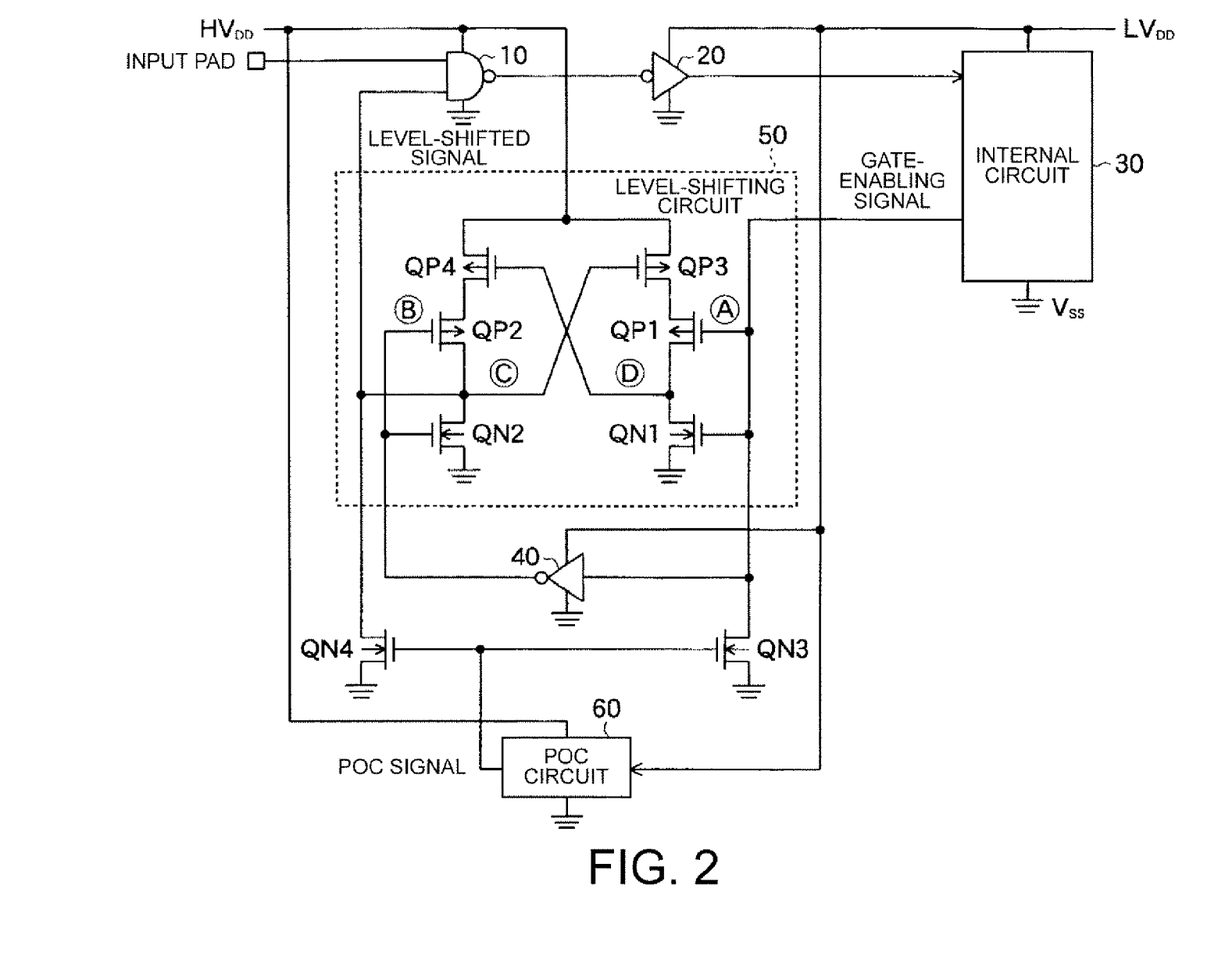
FIG. 2 is a diagram showing the configuration of a semiconductor integrated circuit according to a second embodiment of the invention.

Thus, according to the second embodiment of the invention, a semiconductor integrated circuit is prevented from a through current that occurs in the level-shifting circuit 50, by having a potential-fixing circuit that fixes the potential at either of the first and the second input terminals and the potential at either of the first and the second output terminals of the level-shifting circuit 50 when the supply potential $HV_{DD}$ is fed and the supply potential $LV_{DD}$ is not fed.

FIG. 2 is a diagram showing the configuration of a semiconductor integrated circuit according to the second embodiment of the invention. In addition to the configuration of the semiconductor integrated circuit according to the first embodiment, which is shown in FIG. 1, the semiconductor integrated circuit according to the present embodiment includes, as a potential-fixing circuit, a power-on-control (POC) circuit 60 and N-channel MOS transistors QN3 and QN4.

When fed with the supply potential $HV_{DD}$, the POC circuit 60 detects as to whether or not the supply potential $LV_{DD}$ is fed, thus outputting a high-level POC signal when the supply potential $LV_{DD}$ is not fed and a low-level POC signal when the supply potential $LV_{DD}$ is fed. The POC signal outputted from the POC circuit 60 are fed to the gates of the transistors QN3 and QN4.

The drain of the transistor QN3 is connected to the first input terminal (node A) of the level-shifting circuit 50, while the source thereof is connected to the reference potential $V_{SS}$. The drain of the transistor QN4 is connected to the first output terminal (node C) of the level-shifting circuit 50, while the source thereof is connected to the reference potential $V_{SS}$.

Thus, when the supply potential $HV_{DD}$ is fed and the supply potential $LV_{DD}$ is not fed, the transistor QN3 fixes the potential at the first input terminal (node A) at a low level and the transistor QN4 fixes the potential at the first output terminal (node C) at a low level.

When the potentials at the node A and node C turn low-level, the transistors QP3 and QP1 are turned ON and the transistor QN1 is turned OFF. Furthermore, the potential at the node D turns high-level and the transistor QP4 is cut off Therefore, a through current can be prevented from occurring in the level-shifting circuit 50 when the supply potential $HV_{DD}$ is fed and the supply potential $LV_{DD}$ is not fed. In addition, since the potential at the node C is fixed at a low level, thereby preventing a through current from occurring in the NAND circuit 10.

Figure 3:
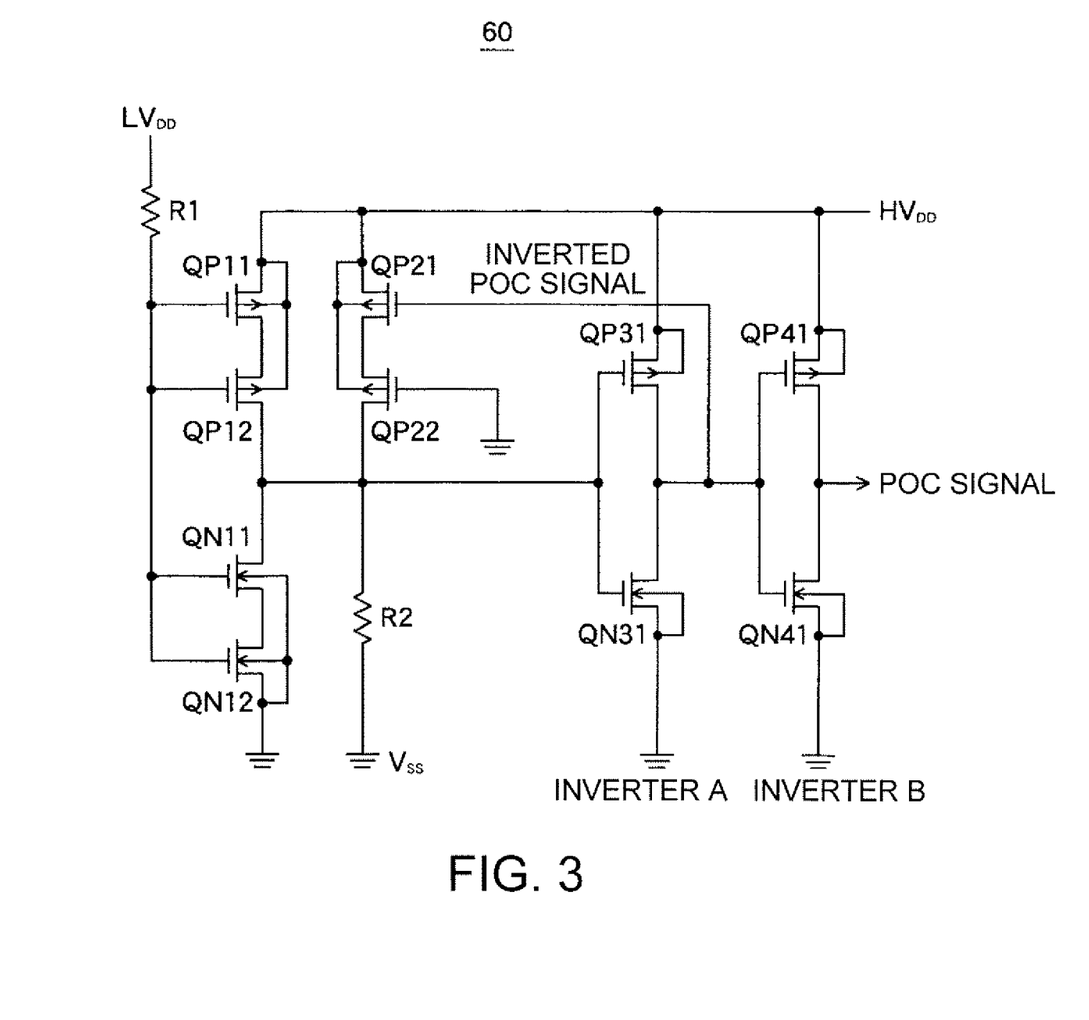
FIG. 3 is a diagram showing the configuration of a POC circuit employed in the embodiments of the invention.

FIG. 3 is a circuit diagram showing the configuration of a POC circuit employed in the embodiments of the invention. The POC circuit 60 includes (1) a resistance R1 that is connected to the supply potential $LV_{DD}$, (2) P-channel MOS transistors QP11 to QP12 and N-channel MOS transistors QN11 to QN12, being serially connected, (3) P-channel MOS transistors QP21 to QP22 and a resistance R2, being serially connected, (4) a P-channel MOS transistor QP31 and an N-channel MOS transistor QN31 constituting an inverter A and (5) a P-channel MOS transistor QP41 and an N-channel MOS transistor QN41 constituting an inverter B.

When the supply potential $LV_{DD}$ is not fed, the transistors QP11 to QP12 are turned ON while the transistors QN11 to QN12 are turned OFF because the supply potential $LV_{DD}$ is low-level. Therefore, the inverter A that is inputted with a high-level signal outputs a low-level inverted POC signal, whereas the inverter B that is inputted with a low-level inverted POC signal outputs a high-level POC signal. The inverted POC signal is fed back positively to the transistor QP21 to further stabilize the state. On the contrary, when the supply potential $LV_{DD}$ is fed, the relationship is reversed between the levels of the parts, with the inverter A outputting a high-level inverted POC signal and the inverter B outputting a low-level POC signal.

Next, a third embodiment of the invention will be described.

Figure 4:
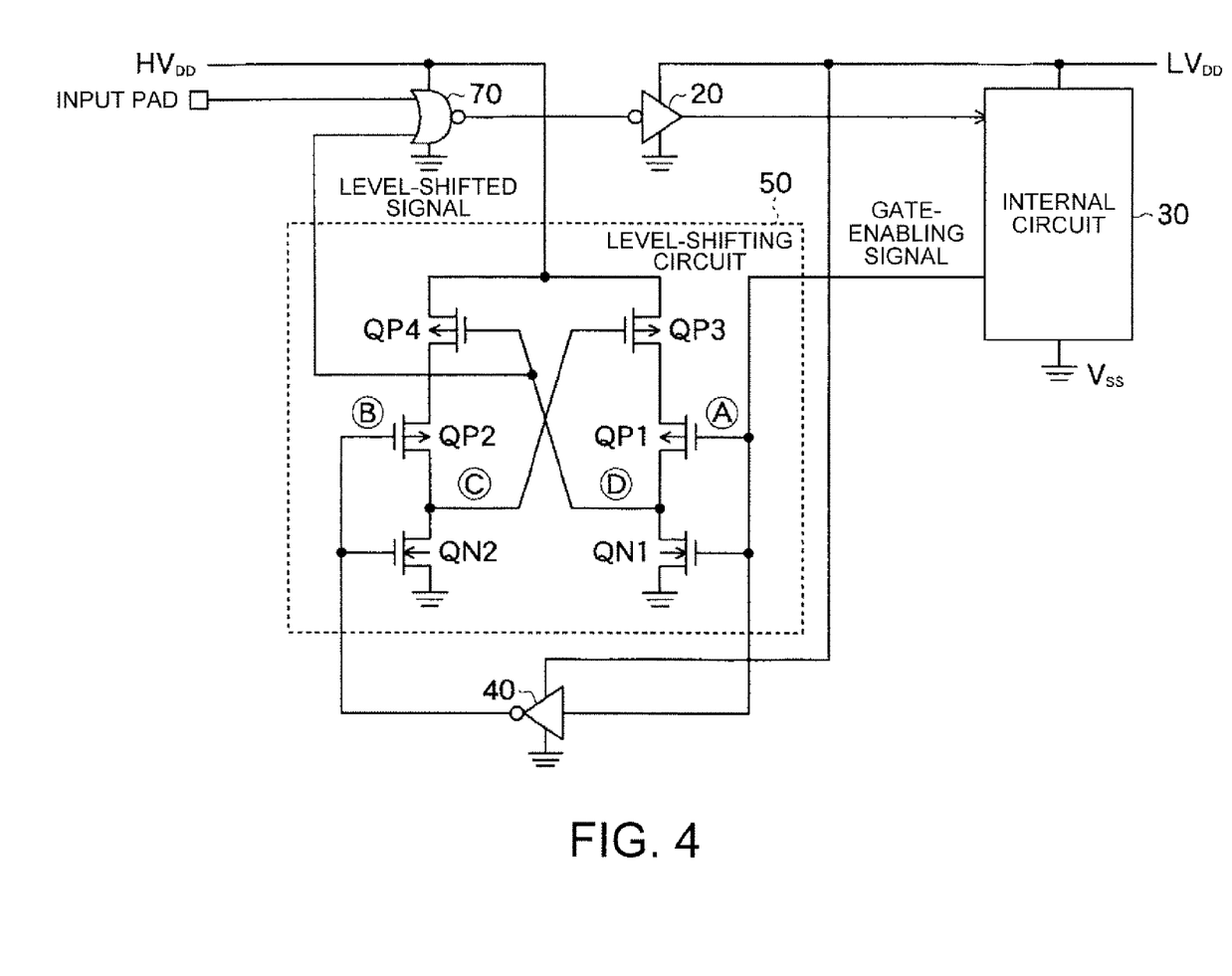
FIG. 4 is a diagram showing the configuration of a semiconductor integrated circuit according to a third embodiment of the invention.

FIG. 4 is a diagram showing the configuration of a semiconductor integrated circuit according to the third embodiment of the invention. This semiconductor integrated circuit has the configuration of the semiconductor integrated circuit according to the first embodiment, which is shown in FIG. 1, except that a NOR circuit 70 is used instead of the NAND circuit 10. In this case, a level-shifted signal outputted from the second output terminal (node D) of the level-shifting circuit 50 (hereinafter referred to as the "second level-shifted signal") is fed to either of the input terminals of the NOR circuit 70. The NOR circuit 70 sets up a logical addition of an input signal inputted via an input pad and the second level-shifted signal outputted from the level-shifting circuit 50, to invert and output the result.

Such a configuration of the input circuit prevents a through current from occurring in the input circuit, by making the second level-shifted signal being outputted from the level-shifting circuit 50 to be high-level, and the output from the NOR circuit 70 to be fixed at a low level, during the time $T_A$ where the gate-enabling signal is low-level even though the supply potential $HV_{DD}$ is fed, as shown in FIG. 10.

Instead of the second level-shifted signal outputted from the second output terminal (node D) of the level-shifting circuit 50, the level-shifted signal outputted from the first output terminal (node C) may be fed to the other input terminal of the NOR circuit 70, after being inverted by the inverter operating at the supply potential $HV_{DD}$.

Next, a fourth embodiment of the invention will be described.

In the semiconductor integrated circuit according to the third embodiment of the invention, which is shown in FIG. 4, the supply potential $HV_{DD}$ is fed in some cases even though the supply potential $LV_{DD}$ is not fed, due to the reason, for example, that the external circuit connected to the input pad is in operation. Since, in such a case, the outputs from the internal circuit 30 and the inverter 40 are in a high-impedance state (inconsistency in potential), a through current may flow via the transistors QP3, QP1 and QN1, depending on the potentials at the node A and node B. Also, a through current may flow via the transistors QP4, QP2 and QN2, depending on the potential at the node A and node B.

Figure 5:
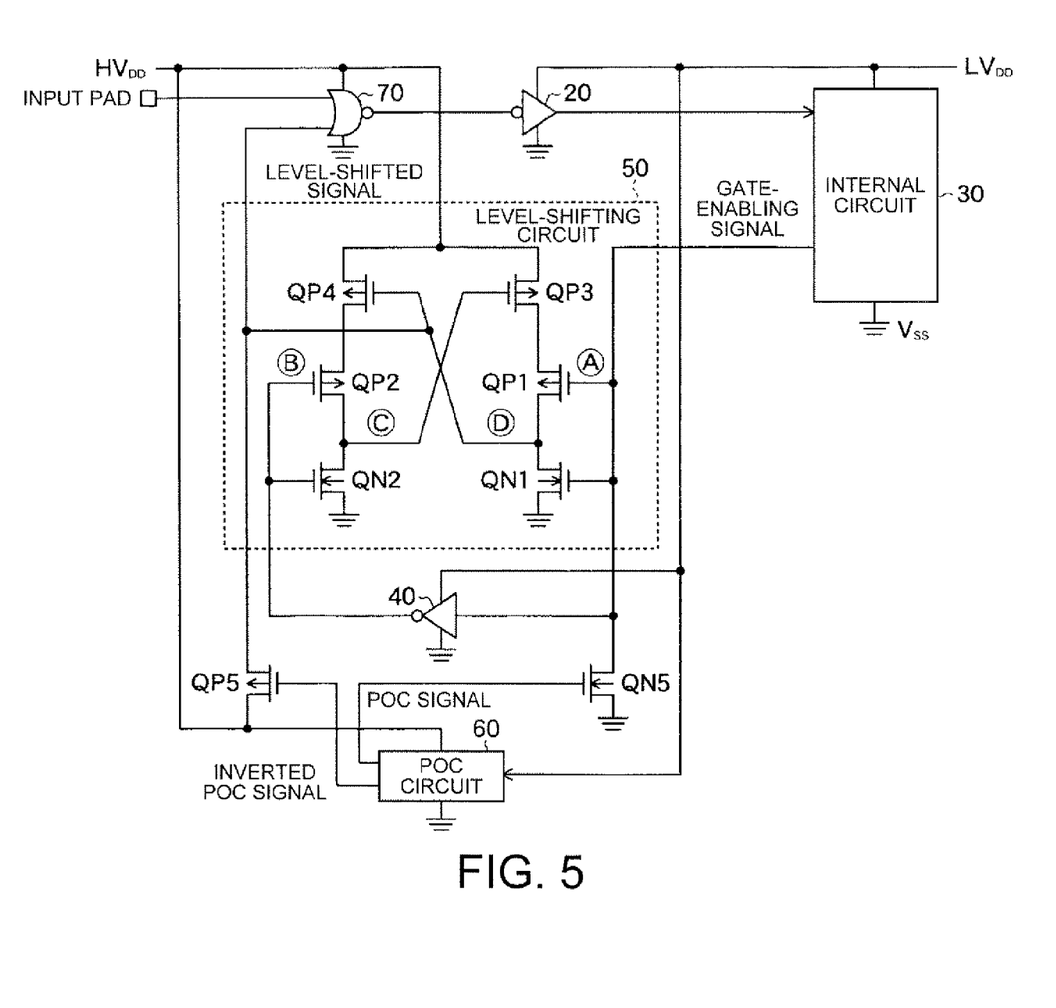
FIG. 5 is a diagram showing the configuration of a semiconductor integrated circuit according to a fourth embodiment of the invention.

Thus, the fourth embodiment of the invention prevents a through current from occurring in the level-shifting circuit 50 by including a potential-fixing circuit that fixes the potentials at either of the first and the second input terminals and at either of the first and the second output terminals of the level-shifting circuit 50 when the supply potential $HV_{DD}$ is fed and the supply potential $LV_{DD}$ is not fed.

FIG. 5 is a diagram showing the configuration of a semiconductor integrated circuit according to the fourth embodiment of the invention. In addition to the configuration of the semiconductor integrated circuit according to the third embodiment shown in FIG. 4, the semiconductor integrated circuit here includes, as a potential-fixing circuit, a POC circuit 60 and an N-channel MOS transistor QN5 and a P-channel MOS transistor QP5. A POC signal outputted from the POC circuit 60 is fed to the gate of the transistor QN5, while an inverted POC signal outputted from the POC circuit 60 is fed to the gate of the transistor QP5.

The drain of the transistor QN5 is connected to the first input terminal (node A) of the level-shifting circuit 50, while the source thereof is connected to the ground potential $HV_{SS}$. On the other hand, the drain of the transistor QP5 is connected to the second output terminal (node D) of the level-shifting circuit 50, while the source thereof is connected to the supply potential $HV_{DD}$.

Thus, when the supply potential $HV_{DD}$ is fed and the supply potential $LV_{DD}$ is not fed, the transistor QN5 is made to fix the potential at the first input terminal (node A) at a low level while the transistor QP5 is made to fix the potential at the second output terminal (node D) at a high level.

As the potential at the node A is low-level, the transistor QN1 turns into an OFF state. As the potential at the node D is high-level, the transistor QP4 turns into an OFF state. Thus, a through current can be prevented in the level-shifting circuit 50 when the supply potential $HV_{DD}$ is fed and the supply potential $LV_{DD}$ is not fed. Furthermore, since the potential at the node D is fixed at a high level, a through current can be prevented in the NOR circuit 70.

In cases where the level-shifted signal outputted from the first output terminal (node C) of the level-shifting circuit 50, instead of the second level-shifted signal outputted from the second output terminal (node D) thereof, is inverted by the inverter, the transistors QN3 and QN4 are used in the potential-fixing circuit, in the same way as in the second embodiment shown in FIG. 2.

Next, a fifth embodiment of the invention will be described.

Figure 6:
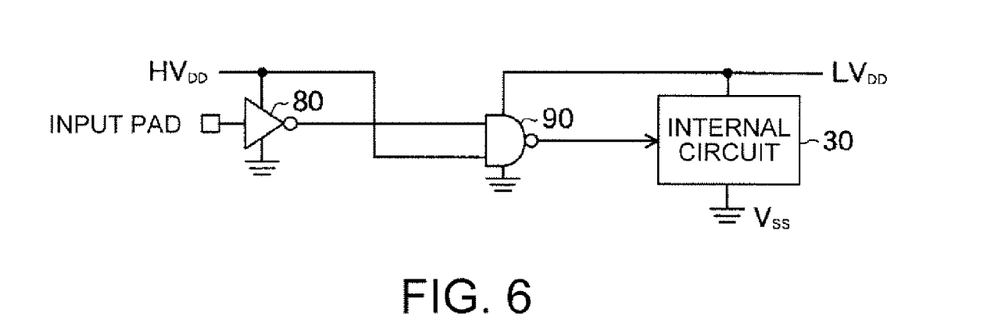
FIG. 6 is a diagram showing the configuration of a semiconductor integrated circuit according to a fifth embodiment of the invention.

FIG. 6 is a diagram showing the configuration of a semiconductor integrated circuit according to the fifth embodiment of the invention. This semiconductor integrated circuit has (1) the internal circuit 30 that operates at the supply potential $LV_{DD}$, (2) the first input circuit (an inverter 80 in the present embodiment) that operates on the basis of an input signal inputted via an input pad, when the supply potential $HV_{DD}$ is fed and (3) a second input circuit (a NAND circuit 90 in the embodiment) that performs a logical operation on the basis of the signal outputted from the first input circuit and the level of the supply potential $HV_{DD}$, thereby outputting a signal, corresponding to the signal outputted from the first input circuit, to the internal circuit 30 when the supply potential $HV_{DD}$ is fed, while fixing the output level when the supply potential $HV_{DD}$ is not fed.

The inverter 80 inverts and outputs the input signal inputted via the input pad, when the supply potential $HV_{DD}$ is fed. The NAND circuit 90 sets up a logical multiplication of the signal outputted from the inverter 80 and the level of the supply potential $HV_{DD}$, to invert and output the result.

Such a configuration of the input circuits prevents through currents in the input circuits, because the output from the NAND circuit 90 is fixed at a high level during the time where the supply potential $HV_{DD}$ is not fed and the supply potential $LV_{DD}$ is fed.

Next, a sixth embodiment of the invention will be described.

Figure 7:
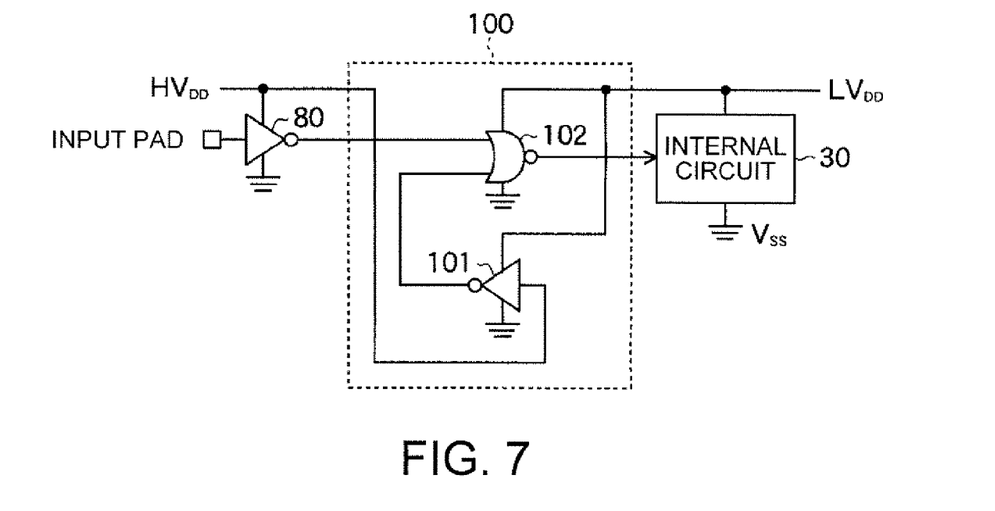
FIG. 7 is a diagram showing the configuration of a semiconductor integrated circuit according to a sixth embodiment of the invention.

FIG. 7 is a diagram showing the configuration of a semiconductor integrated circuit according to the sixth embodiment of the invention. Instead of the NAND circuit 90 in the fifth embodiment shown in FIG. 6, the sixth embodiment includes, as a second input circuit 100, (1) an inverter 101 that inverts the level of the supply potential $HV_{DD}$ when the supply potential $LV_{DD}$ is fed and (2) a NOR circuit 102 that sets up a logical addition of the signal outputted from the first input circuit (the inverter 80 in the present embodiment) and the level of the inverted supply potential $HV_{DD}$ when the supply potential $LV_{DD}$ is fed, instead of the NAND circuit 90 in the fifth embodiment shown in FIG. 6.

Such a configuration of the input circuits prevents through currents from flowing in the input circuits, because the output signal from the inverter 101 is high-level while the output from the NOR circuit 102 is fixed at a low level during the time where the supply potential $HV_{DD}$ is not fed and the supply potential $LV_{DD}$ is fed.

Any one of the first through the fourth embodiments combined with either the fifth or the sixth embodiment, each of which is described above, allows provision of a semiconductor integrated circuit that is capable of responding to any difference caused between the ON/OFF timing of the supply potential $HV_{DD}$ and the timing of any change in the gate-enabling signal. As an example, a seventh embodiment of the invention will be described, which is a combination of the first and the fifth embodiments.

Figure 8:
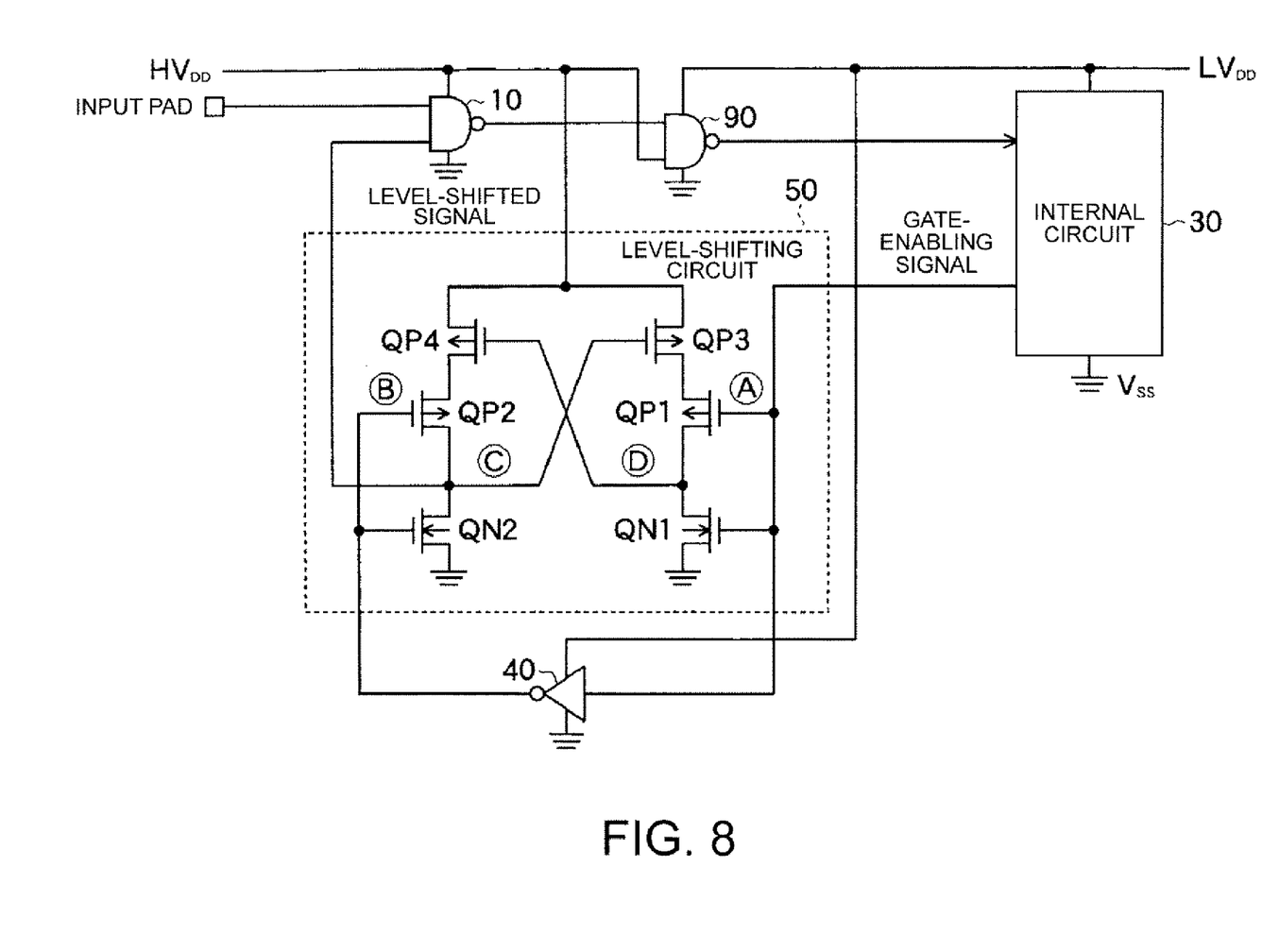
FIG. 8 is a diagram showing the configuration of a semiconductor integrated circuit according to a seventh embodiment of the invention.

FIG. 8 is a diagram showing the configuration of a semiconductor integrated circuit according to the seventh embodiment of the invention. As shown therein, the semiconductor integrated circuit has (1) a first input circuit (the NAND circuit 10 in the present embodiment) that operates on the basis of an input signal inputted from an external circuit via an input pad when the supply potential $HV_{DD}$ is fed, (2) a second input circuit (the NAND circuit 90 in the present embodiment) that operates on the basis of the signal outputted from the first input circuit when the supply potential $LV_{DD}$ is fed, (3) the internal circuit 30 that operates on the basis of the signal fed from the second input circuit when the supply potential $LV_{DD}$ is fed, (4) the inverter 40 that inverts a gate-enabling signal fed from the internal circuit and outputs an inverted gate-enabling signal, when the supply potential $LV_{DD}$ is fed and (5) the level-shifting circuit 50 that outputs a level-shifted signal on the basis of the gate-enabling signal or the inverted gate-enabling signal.

The NAND circuit 10 operating as the first input circuit sets up a logical multiplication of an input signal and a level-shifted signal when the supply potential $HV_{DD}$ is fed, to invert and output the result. The NAND circuit 90 operating as the second input circuit sets up a logical multiplication of the signal outputted from the NAND circuit 10 and the level of the supply potential $HV_{DD}$ when the supply potential $LV_{DD}$ is fed, to invert and output the result.

The internal circuit 30 operates on the basis of an output signal from the NAND circuit 90 and generates a gate-enabling signal that is synchronized with the ON/OFF of the supply potential $HV_{DD}$, when the supply potential $LV_{DD}$ is fed. The inverter 40 inverts the gate-enabling signal to output the inverted gate-enabling signal, when the supply potential $LV_{DD}$ is fed.

The level-shifting circuit 50 inputs the gate-enabling signal to the first input terminal (node A), while inputting the inverted gate-enabling signal to the second input terminal (node B). When the supply potential $HV_{DD}$ is fed, the level-shifting circuit 50 generates, at the first output terminal (node C) and the second output terminal (node D), respectively, level-shifted signals of the respective signals inputted to the first and the second input terminals, to output a level-shifted signal from either of the first and second output terminals (the first output terminal (node C) in the present embodiment).

Such a configuration of the input circuits prevents through currents from occurring in the input circuits, by making the level-shifted signal outputted from the level-shifting circuit 50 to be low-level while fixing the output from the NAND circuit 10 at a high level during the time $T_A$ where the gate-enabling signal is low-level even though the supply potential $HV_{DD}$ is fed, as shown in FIG. 10.

The configuration also prevents a through current from occurring in the internal circuit by fixing the output from the NAND circuit 90 at a high level, during the time $T_B$ where the gate-enabling signal is high-level even though the supply potential $HV_{DD}$ is not fed, as shown in FIG. 10.

In the present embodiment, the combination of the first and the fifth embodiments was described as an example, but any one of the second through the fourth embodiments may be used in place of the first embodiment, and the sixth embodiment may be used in place of the fifth embodiment.

What is claimed is:

1. A semiconductor integrated circuit that operates at two or more supply potentials including a first supply potential and a second supply potential that is higher than the first supply potential, the semiconductor integrated circuit comprising:

an internal circuit that operates at a first supply potential;

an inverter that inverts a control signal fed from the internal circuit and outputs an inverted control signal, when the first supply potential is fed;

a level-shifting circuit that inputs the control signal to a first input terminal while inputting the inverted control signal to a second input terminal, and outputs, from an output terminal, a level-shifted signal of the signal input to the first input terminal or the second input terminal, when the second supply potential is fed;

a first input circuit that performs a logical operation on the basis of an input signal input via an input pad and a level-shifted signal output from the level-shifting circuit, when the second supply potential is fed, the first input circuit outputting a signal corresponding to the input signal when the control signal is activated, while fixing the output level when the control signal is deactivated;

a second input circuit that operates on the basis of the signal output from the first input circuit when the first supply potential is fed, the second input circuit feeding a signal to the internal circuit; and a potential-fixing circuit that fixes potentials at either of the first input terminal and the second input terminal and the output terminal of the level shifting circuit, when the second supply potential is fed whereas the first potential is not fed.

2. The semiconductor integrated circuit according to claim 1, the first input circuit setting up a logical multiplication of the input signal inputted via the input pad and the level-shifted signal outputted from the level-shifting circuit, when the second supply potential is fed.

3. The semiconductor integrated circuit according to claim 2, the level-shifting circuit comprising:
   a first P-channel MOS transistor and a first N-channel MOS transistor, being serially connected and having a gate that is connected to the first input terminal;
   a second P-channel MOS transistor and a second N-channel MOS transistor, having a gate that is connected to the second input terminal and a drain that is connected to the output terminal;
   a third P-channel MOS transistor feeding currents to the first P-channel MOS transistor and the first N-channel MOS transistor; and
   a fourth P-channel MOS transistor feeding currents to the second P-channel MOS transistor and the second N-channel MOS transistor,
   the potential-fixing circuit fixing the potentials at the first input terminal and the output terminal of the level-shifting circuit at a low level, when the second supply potential is fed whereas the first supply potential is not.

4. The semiconductor integrated circuit according to claim 1, the first input circuit setting up a logical addition of the input signal inputted via the input pad and the level-shifted signal outputted from the level-shifting circuit, when the second supply potential is fed.

5. The semiconductor integrated circuit according to claim 4, the level-shifting circuit comprising:
   the first P-channel MOS transistor and the first N-channel MOS transistor, being serially connected and having a gate that is connected to the first input terminal and a drain that is connected to the output terminal;
   the second P-channel MOS transistor and the second N-channel MOS transistor having a gate that is connected to the second input terminal;
   the third P-channel MOS transistor feeding a current to the first P-channel MOS transistor and the first N-channel MOS transistor; and
   a fourth P-channel MOS transistor feeding a current to the second P-channel MOS transistor and the second N-channel MOS transistor,
   the potential-fixing circuit fixing the potential at the first input terminal of the level-shifting circuit at a low level, while fixing the potential at the output terminal at a high level, when the second supply potential is fed whereas the first supply potential is not.

6. The semiconductor integrated circuit according to claim 1, the second input circuit performing a logical operation, when the first supply potential is fed, on the basis of the signal outputted from the first input circuit and the level of the second supply potential, thereby outputting a signal, corresponding to the signal outputted from the first input circuit, to the internal circuit while fixing the output level when the second supply potential is not fed.

7. A semiconductor integrated circuit operating at two or more supply potentials including a first supply potential and a second supply potential that is higher than the first supply potential, comprising:
   an internal circuit powered by the first supply potential;
   a first input circuit powered by the second supply potential that operates based on an input signal inputted via an input pad;
   a second input circuit powered by the first supply potential that performs a logical operation based on first and second inputs, where the first input is a signal outputted from the first input circuit and the second input is a level of the second supply potential, the second input circuit thereby outputting a signal, corresponding to the signal outputted from the first input circuit, to the internal circuit when the second supply potential is fed, while fixing the output level when the second supply potential is not fed.

8. The semiconductor integrated circuit according to claim 7, the second input circuit setting up a logical multiplication of the signal outputted from the first input circuit and the level of the second supply potential, when the first supply potential is fed.

9. The semiconductor integrated circuit according to claim 7, the second input circuit inverting the level of the second supply potential and setting up a logical addition of the signal outputted from the first input circuit and the level of the inverted second supply potential.

10. A semiconductor integrated circuit that operates at two or more supply potentials including a first supply potential and a second supply potential that is higher than the first supply potential, the semiconductor integrated circuit comprising:
    an internal circuit powered by the first supply potential that outputs a control signal;
    a level-shifting circuit powered by the second supply potential that receives the control signal and outputs, from an output terminal, a level-shifted signal of the control signal;
    a first input circuit powered by the second supply potential that performs a logical operation based on an input signal inputted via an input pad and the level-shifted signal outputted from the level-shifting circuit, thereby outputting a signal corresponding to the input signal when the control signal is activated, while fixing the output level when the control signal is deactivated;
    a second input circuit powered by the first supply potential that operates on the basis of the signal outputted from the first input circuit, thereby feeding a signal to the internal circuit; and
    a potential fixing circuit that fixes the potentials at either of the input terminal and the output terminal of the level-shifting circuit, when the second supply potential is fed whereas the first supply potential is not.

* * * * *